(12) United States Patent
Matsushita et al.

(10) Patent No.: US 8,404,513 B2
(45) Date of Patent: Mar. 26, 2013

(54) SOLAR CELL

(75) Inventors: Akio Matsushita, Kyoto (JP); Akihiro Itoh, Kyoto (JP); Tohru Nakagawa, Shiga (JP); Hidetoshi Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/486,843

(22) Filed: Jun. 1, 2012

(65) Prior Publication Data

US 2012/0301993 A1 Nov. 29, 2012

Related U.S. Application Data

(63) Continuation of application No. PCT/JP2011/006974, filed on Dec. 14, 2011.

(30) Foreign Application Priority Data

Apr. 27, 2011 (JP) ................................. 2011-099178

(51) Int. Cl.
*H01L 21/00* (2006.01)
*H01L 29/15* (2006.01)
*H01L 31/0256* (2006.01)
*H01L 27/14* (2006.01)
*H01L 21/0203* (2006.01)
*H01L 31/06* (2006.01)
*H01L 31/00* (2006.01)

(52) U.S. Cl. ................ 438/93; 438/59; 438/57; 438/98; 438/69; 257/414; 257/434; 257/461; 257/464; 257/76; 136/243; 136/259; 136/261; 136/262

(58) Field of Classification Search .......................... None
See application file for complete search history.

(56) References Cited

U.S. PATENT DOCUMENTS

| | | | | |
|---|---|---|---|---|
| 4,591,654 A | * | 5/1986 | Yamaguchi et al. | 136/252 |
| 5,911,839 A | * | 6/1999 | Tsai et al. | 136/262 |
| 7,842,881 B2 | * | 11/2010 | Comfeld et al. | 136/261 |
| 8,138,002 B2 | * | 3/2012 | Yashima et al. | 438/40 |
| 2003/0015700 A1 | * | 1/2003 | Eisenbeiser et al. | 257/53 |
| 2010/0089440 A1 | * | 4/2010 | Gray et al. | 136/255 |
| 2010/0326496 A1 | * | 12/2010 | Bhattacharya et al. | 136/249 |
| 2010/0326518 A1 | * | 12/2010 | Juso et al. | 136/256 |
| 2011/0005570 A1 | * | 1/2011 | Jain | 136/244 |
| 2012/0238084 A1 | * | 9/2012 | Pan | 438/481 |

FOREIGN PATENT DOCUMENTS

| | | |
|---|---|---|
| JP | 09-064386 | 3/1997 |
| JP | 2008-124381 | 5/2008 |

OTHER PUBLICATIONS

Jenny Nelson, "The Physics of Solar Cells," World Scientific Pub Co., Inc. International Search Report issued in International Patent Application No. PCT/JP2011/006974, filed Dec. 14, 2011.

* cited by examiner

*Primary Examiner* — Seahvosh Nikmanesh
*Assistant Examiner* — Evren Seven
(74) *Attorney, Agent, or Firm* — McDermott Will & Emery LLP

(57) ABSTRACT

A method for generating electric power including the steps of: (a) preparing a solar cell having a condensing lens and a solar cell element, wherein the solar cell element includes an n-type GaAs layer, a p-type GaAs layer, a quantum tunneling layer, an n-type InGaP layer, a p-type InGaP layer, a p-type window layer, an n-side electrode, and a p-side electrode, and satisfies the following equation (I): $d2<d1$, $d3<d1$, 1 nanometer$\leq d2\leq 4$ nanometers, 1 nanometer$\leq d3\leq 4$ nanometers, $d5<d4$, $d6<d4$, 1 nanometer$\leq d5\leq 5$ nanometers, 1 nanometer$\leq d6\leq 5$ nanometers, 100 nanometers$\leq w2$, 100 nanometers$\leq w3$, 100 nanometers$\leq w4$, and 100 nanometers$\leq w5$... (I); and (b) irradiating a region S which is included in the surface of the p-type window layer through the condensing lens with light to satisfy the following equation (II) in order to generate a potential difference between the n-side electrode and the p-side electrode: $w6\leq w1$... (II).

8 Claims, 7 Drawing Sheets

SOLAR CELL

This is a continuation of International Application No. PCT/JP2011/006974, with an international filing date of Dec. 14, 2011, which claims priority of Japanese Patent Application No. 2011-099178, filed on Apr. 27, 2011, the contents of which are hereby incorporated by reference.

TECHNICAL FIELD

The present invention relates to a solar cell.

BACKGROUND ART

FIG. 6 shows a solar cell disclosed in Patent Literature 1. The conventional solar cell comprises a plurality of photoelectric conversion layers 13, the photoelectric conversion layer 13 having a solar cell element 11 and a lens L. The solar cell element 11 comprises a p-type GaAs buffer layer 13a, a p-type InGaP-BSF layer 13b, a p-type GaAs base layer 13c, an n-type GaAs emitter layer 13d, an n-type InGaP window layer 13e, and an antireflection layer 15. These layers 13a to 15 are stacked on a semiconductor substrate 12 in this order. The solar cell element 11 further comprises a separation grid 16 which separates the photoelectric conversion layer 13, a contact layer 14 around the detector side of the photoelectric conversion layer 13, a recoupling prevention layer 17 around the outer circumference of the contact layer 14, a detector side electrode 18 and a back side electrode 19.

Sunlight penetrates the lens L and the antireflection layer 15, and the n-type InGaP window layer 13e is irradiated with the sunlight. This irradiation of the sunlight generates electric power.

FIG. 7 shows a solar cell disclosed in Patent Literature 2. The conventional solar cell comprises a top cell 1 made of InGaP and a bottom cell 2 made of GaAs. The top cell 1 and the bottom cell 2 are joined electrically through a quantum tunneling layer 3. The top cell 1 absorbs light having a wavelength different from the wavelength of light absorbed by the bottom cell 2 so as to cause the solar cell to generate electric power efficiently.

CITATION LIST

Patent Literatures
[Patent Literature 1]
Japanese Laid-Open Patent Application Publication No. 2008-124381
[Patent Literature 2]
Japanese Laid-Open Patent Application Publication No. H 9-64386
Non Patent Literature
[Non Patent Literature 1]
Jenny Nelson, "The Physics of Solar Cells", World Scientific Pub Co Inc.

SUMMARY OF THE INVENTION

Technical Problem

According to the experiment performed by the present inventors, the solar cell obtained by combining the solar cell element disclosed in Patent Literature 2 with the lens disclosed in Patent Literature 1 has a conversion efficiency of approximately 25%.

The purpose of the present invention is to provide a solar cell having higher conversion efficiency.

Solution to Problems

The present disclosure is directed to a method for generating electric power with use of a solar cell, the method comprising steps of;

(a) preparing the solar cell comprising a condensing lens (101) and a solar cell element (102), wherein the solar cell element (102) comprises an n-type GaAs layer (104), a p-type GaAs layer (103), a quantum tunneling layer (108), an n-type InGaP layer (106), a p-type InGaP layer (105), a p-type window layer (107), an n-side electrode (114), and a p-side electrode (115);

a Z-direction denotes the direction of the normal line of the p-type GaAs layer (103);

an X-direction denotes a direction orthogonal to the Z-direction, the n-type GaAs layer (104), the p-type GaAs layer (103), the quantum tunneling layer (108), the n-type InGaP layer (106), the p-type InGaP layer (105), and the p-type window layer (107) are stacked along the Z-direction in this order;

the p-type window layer (107) is made of a p-type compound semiconductor having a wider bandgap than InGaP, the n-side electrode (114) is electrically connected with the n-type GaAs layer (104);

the p-side electrode (115) is electrically connected with the p-type InGaP layer (105);

the n-type GaAs layer (104) is divided into a GaAs center part (104a), a first GaAs peripheral part (104b), and a second GaAs peripheral part (104c);

the GaAs center part (104a) is interposed between the first GaAs peripheral part (104b) and the second GaAs peripheral part (104c) along the X-direction;

the first GaAs peripheral part (104b) and the second GaAs peripheral part (104c) have a shape of a layer, the n-type InGaP layer (106) is divided into an InGaP center part (106a), a first InGaP peripheral part (106b), and a second InGaP peripheral part (106c);

the InGaP center part (106a) is interposed between the first InGaP peripheral part (106b) and the second InGaP peripheral part (106c) along the X-direction;

the first InGaP peripheral part (106b) and the second InGaP peripheral part (106c) have a shape of a layer, the following inequation set (I) is satisfied:

$$d2<d1, d3<d1, 1 \text{ nanometer} \leq d2 \leq 4 \text{ nanometers}, 1 \text{ nanometer} \leq d3 \leq 4 \text{ nanometers}, d5<d4, d6<d4, 1 \text{ nanometer} \leq d5 \leq 5 \text{ nanometers}, 1 \text{ nanometer} \leq d6 \leq 5 \text{ nanometers}, 100 \text{ nanometers} \leq w2, 100 \text{ nanometers} \leq w3, 100 \text{ nanometers} \leq w4, \text{ and } 100 \text{ nanometers} \leq w5 \qquad (I);$$

wherein d1 represents a thickness of the GaAs center part (104a) along the Z-direction;

d2 represents a thickness of the first GaAs peripheral part (104b) along the Z-direction;

d3 represents a thickness of the second GaAs peripheral part (104c) along the Z-direction;

d4 represents a thickness of the InGaP center part (106a) along the Z-direction;

d5 represents a thickness of the first InGaP peripheral part (106b) along the Z-direction;

d6 represents a thickness of the second InGaP peripheral part (106c) along the Z-direction;

w2 represents a width of the first GaAs peripheral part (104b) along the X-direction;

w3 represents a width of the second GaAs peripheral part (104c) along the X-direction;

w4 represents a width of the first InGaP peripheral part (106b) along the X-direction; and w5 represents a width of the second InGaP peripheral part (106c) along the X-direction; and (b) irradiating a region S which is included in the surface of the p-type window layer (107) through the condensing lens (101) with light in such a manner that the following inequation (II) is satisfied so as to generate a potential difference between the n-side electrode (114) and the p-side electrode (115):

$$w6 \leq w1 \qquad (II)$$

wherein w1 represents a width of the GaAs center part (104a) along the X-direction;

w6 represents a width of the region S along the X-direction in the cross-sectional view which includes the Z-direction; and the first GaAs center part (104a) overlaps the region (S) when seen from the Z-direction.

Advantageous Effect of the Invention

The present invention provides a solar cell having higher conversion efficiency.

DESCRIPTION OF EMBODIMENTS

The exemplary embodiment of the present invention is described below with reference to drawings.

Embodiment 1

(Step (a))

In the step (a), a solar cell is prepared.

Figure 1A:
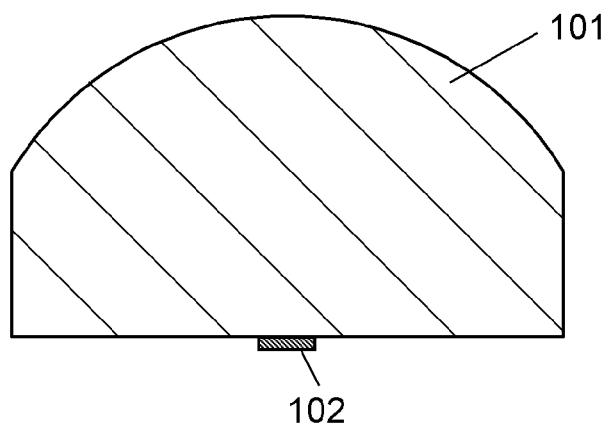
FIG. 1A shows a cross-sectional view of the solar cell according to the embodiment 1.

FIG. 1A shows a cross-sectional view of the solar cell according to the embodiment 1. As shown in FIG. 1A, the solar cell comprises a condensing lens 101 and a solar cell element 102.

Figure 1B:
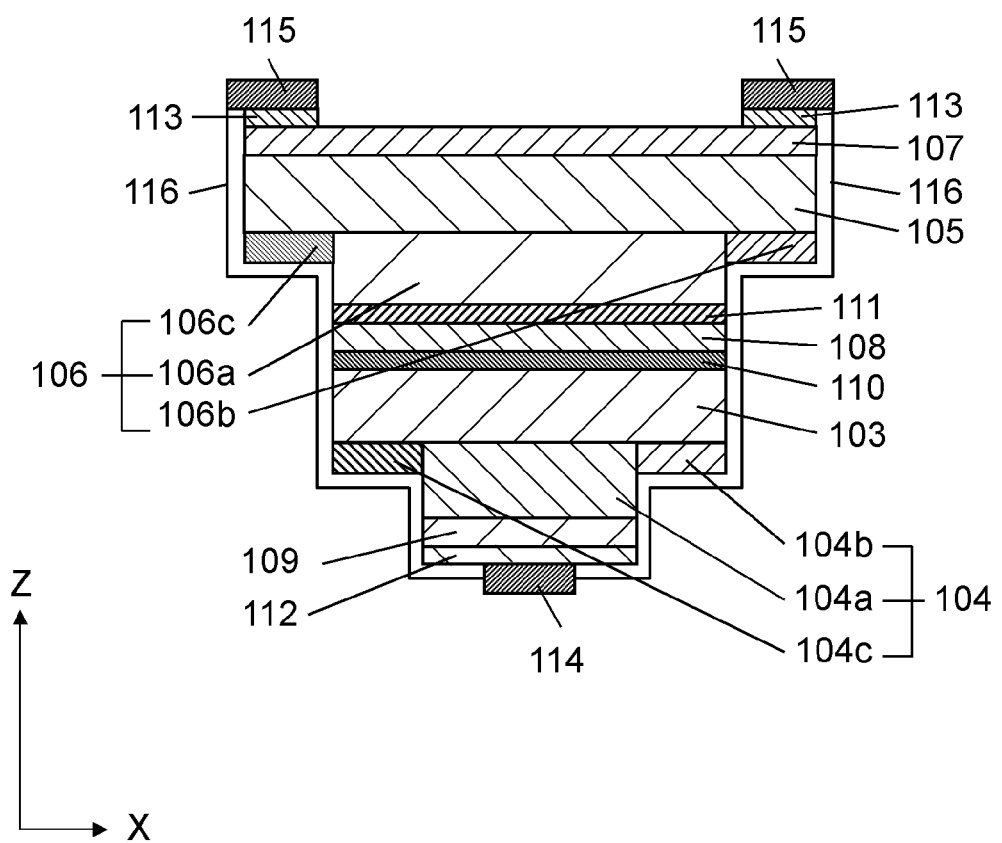
FIG. 1B shows a cross-sectional view of the solar cell element according to the embodiment 1.

As shown in FIG. 1B, the solar cell element 102 comprises an n-type GaAs layer 104, a p-type GaAs layer 103, a quantum tunneling layer 108, an n-type InGaP layer 106, a p-type InGaP layer 105, a p-type window layer 107, an n-side electrode 114, and a p-side electrode 115.

The n-type GaAs layer 104 and the p-type GaAs layer 103 are stacked. The n-type InGaP layer 106 and the p-type InGaP layer 105 are stacked. A Z-direction denotes a stacking direction. Along the Z-direction, the quantum tunneling layer 108 is interposed between the p-type GaAs layer 103 and the n-type InGaP layer 106.

The p-side electrode 115 is electrically connected with the p-type InGaP layer 105. The n-side electrode 114 is electrically connected with the n-type GaAs layer 104.

It is preferable that a first n-type barrier layer 109 and an n-type contact layer 112 are interposed between the n-type GaAs layer 104 and the n-side electrode 114 along the Z-direction. Along the Z-direction, the first n-type barrier layer 109 is interposed between the n-type GaAs layer 104 and the n-type contact layer 112. Along the Z-direction, the n-type contact layer 112 is interposed between the first n-type barrier layer 109 and the n-side electrode 114.

It is preferable that a p-type barrier layer 110 is interposed between the p-type GaAs layer 103 and the quantum tunneling layer 108 along the Z-direction. Along the Z-direction, a second n-type barrier layer 111 is preferably interposed between the n-type InGaP layer 106 and the quantum tunneling layer 108.

Along the Z-direction, it is preferable that a p-type contact layer 113 is interposed between the p-type window layer 107 and the p-side electrode 115. The p-side electrode 115, the p-type contact layer 113, the p-type window layer 107, the p-type InGaP layer 105, the n-type InGaP layer 106, the second n-type barrier layer 111, the quantum tunneling layer 108, the p-type barrier layer 110, the p-type GaAs layer 103, the n-type GaAs layer 104, the first n-type barrier layer 109, the n-type contact layer 112, and the n-side electrode 114 are electrically connected in series in this order.

As shown in FIG. 1B, the n-type GaAs layer 104 is divided into a GaAs center part 104a, a first GaAs peripheral part 104b, and a second GaAs peripheral part 104c. The GaAs center part 104a is interposed between the first GaAs peripheral part 104b and the second GaAs peripheral part 104c along the X-direction. The X-direction is orthogonal to the Z-direction.

As shown in FIG. 1B, the n-type InGaP layer 106 is divided into a InGaP center part 106a, a first InGaP peripheral part 106b, and a second InGaP peripheral part 106c. The InGaP center part 106a is interposed between the first InGaP peripheral part 106b and the second InGaP peripheral part 106c along the X-direction.

Figure 2:
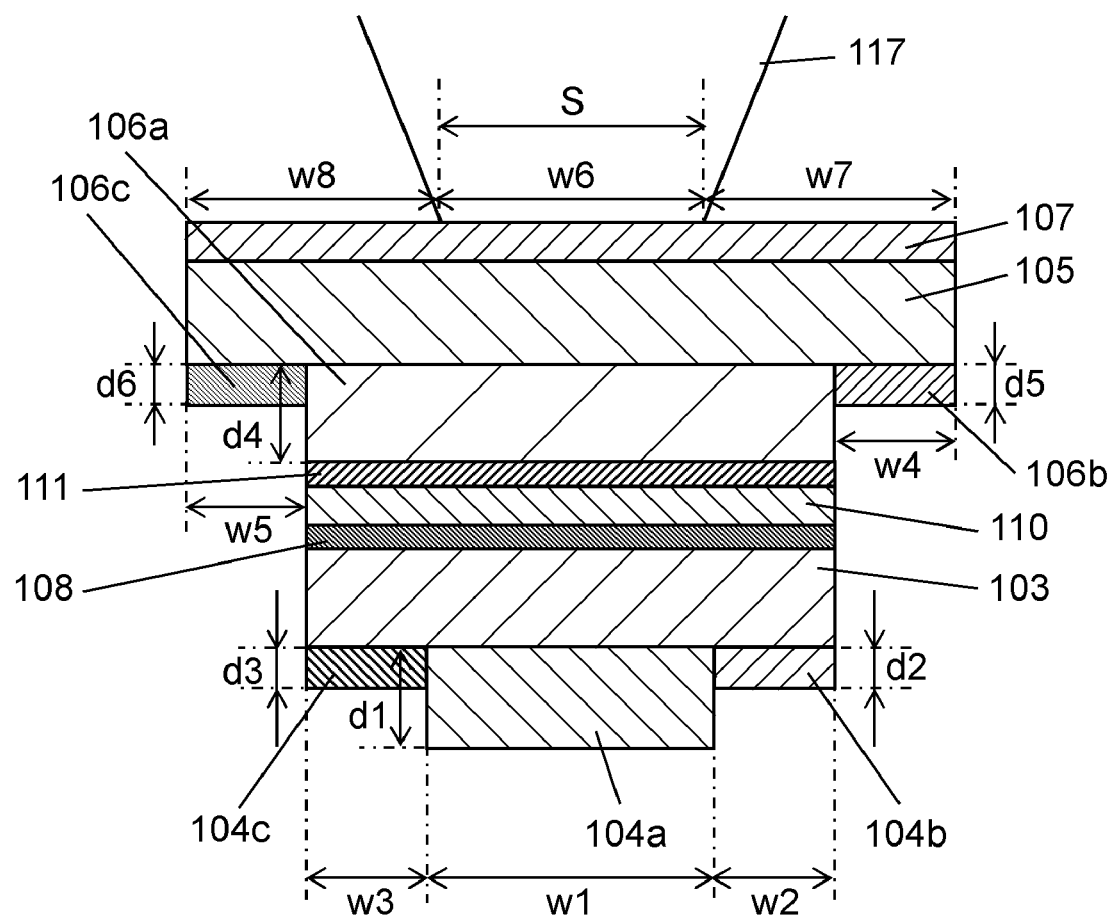
FIG. 2 shows a cross-sectional exploded view of the solar cell element according to the embodiment 1.

As shown in FIG. 2, the thickness d1 of the GaAs center part 104a is greater than the thickness d2 of the first GaAs peripheral part 104b and than the thickness d3 of the second GaAs peripheral part 104c. When the thickness d1 is the same as the thickness d2 and the thickness d3, the higher conversion efficiency is not achieved (see the comparative examples 1 and 2, which are described later).

As shown in FIG. 2, the thickness d4 of the InGaP center part 106a is greater than the thickness d5 of the first InGaP peripheral part 106b and than the thickness d6 of the second InGaP peripheral part 106c. When the thickness d4 is the same as the thickness d5 and the thickness d6, the higher conversion efficiency is not achieved (see the comparative examples 1 and 2, which are described later).

In the embodiment 1, the thickness d2 is not less than 1 nanometer and not more than 4 nanometers. When the thickness d2 is less than 1 nanometer, the higher conversion efficiency is not achieved (see the comparative example 7, which is described later). When the thickness d2 is more than 4 nanometers, the higher conversion efficiency is not achieved (see the comparative examples 4 to 6, which are described later). Similarly, the thickness d3 is also not less than 1 nanometer and not more than 4 nanometers.

In the embodiment 1, the thickness d5 is not less than 1 nanometer and not more than 5 nanometers. When the thickness d5 is less than 1 nanometer, the higher conversion efficiency is not achieved (see the comparative example 10, which is described later). When the thickness d5 is more than 5 nanometers, the higher conversion efficiency is not achieved (see the comparative examples 8 and 9, which are described later). Similarly, the thickness d6 is also not less than 1 nanometer and not more than 5 nanometers.

As shown in FIG. 2, the GaAs center part 104a has a width of w1. The first GaAs peripheral part 104b has a width of w2. The second GaAs peripheral part 104c has a width of w3. The value of w2 is 0.1 micrometer or more. When the value of w2 is less than 0.1 micrometer, the conversion efficiency is decreased. See the comparative example 11, which is described later. For the same reason, the value of w3 is 0.1 micrometer or more.

As shown in FIG. 2, the first InGaP peripheral part 106b has a width of w4. The second InGaP peripheral part 106c has a width of w5. The value of w4 is 0.1 micrometer or more. When the value of w4 is less than 0.1 micrometer, the conversion efficiency is decreased. See the comparative example 12, which is described later. For the same reason, the value of w5 is 0.1 micrometer or more.

Accordingly, the following inequation set (I) is required to be satisfied in the embodiment 1.

$$d2<d1, d3<d1, 1 \text{ nanometer} \leq d2 \leq 4 \text{ nanometers}, 1 \text{ nanometer} \leq d3 \leq 4 \text{ nanometers}, d5<d4, d6<d4, 1 \text{ nanometer} \leq d5 \leq 5 \text{ nanometers}, 1 \text{ nanometer} \leq d6 \leq 5 \text{ nanometers}, 100 \text{ nanometers} \leq w2, 100 \text{ nanometers} \leq w3, 100 \text{ nanometers} \leq w4, \text{ and } 100 \text{ nanometers} \leq w5 \quad \text{(I)}$$

As described above, the value of d1 represents a thickness of the GaAs center part 104a along the Z-direction.

The value of d2 represents a thickness of the first GaAs peripheral part 104b along the Z-direction.

The value of d3 represents a thickness of the second GaAs peripheral part 104c along the Z-direction.

The value of d4 represents a thickness of the InGaP center part 106a along the Z-direction.

The value of d5 represents a thickness of the first InGaP peripheral part 106b along the Z-direction.

The value of d6 represents a thickness of the second InGaP peripheral part 106c along the Z-direction.

The value of w2 represents a width of the first GaAs peripheral part 104b along the X-direction.

The value of w3 represents a width of the second GaAs peripheral part 104c along the X-direction.

The value of w4 represents a width of the first InGaP peripheral part 106b along the X-direction.

The value of w5 represents a width of the second InGaP peripheral part 106c along the X-direction.

The obverse surface of the condensing lens 101 is irradiated with light. This is described in more detail in the step (b), which is described later. Sunlight is preferred.

The reverse surface of the condensing lens 101 is preferably in contact with the solar cell element 102. The light is focused onto the p-type window layer 107 by the condensing lens 101.

It is preferable that the condensing lens 101 has a diameter of approximately 2 millimeters to 10 millimeters, a thickness of approximately 1 millimeter to 5 millimeters, and a refractive index of approximately 1.1 to 2.0.

The material of the condensing lens 101 is not limited. An example of the material of the condensing lens 101 is glass or resin.

The p-type window layer 107 is made of a p-type compound semiconductor having a lattice constant close to that of InGaP and having a wider bandgap than InGaP. An example of the material of the p-type window layer 107 is p-type InAlGaP or p-type InAlAs.

The first n-type barrier layer 109 is made of an n-type compound semiconductor having a lattice constant close to that of GaAs and having a wider bandgap than GaAs. An example of the material of the first n-type barrier layer 109 is n-type InGaP or n-type AlGaAs.

The second n-type barrier layer 111 is made of an n-type compound semiconductor having a lattice constant close to that of InGaP and having a wider bandgap than InGaP. An example of the material of the second n-type barrier layer 111 is n-type InAlGaP or n-type InAlP.

The p-type barrier layer 110 is made of a p-type compound semiconductor having a lattice constant close to that of GaAs and having a wider bandgap than GaAs. An example of the material of the p-type barrier layer 110 is p-type InGaP or p-type AlGaAs.

The quantum tunneling layer 108 is composed of a p-type semiconductor layer and an n-type semiconductor layer. A p-n junction is formed between the p-type semiconductor layer and the n-type semiconductor layer. The p-type semiconductor layer is doped at a high concentration. The n-type semiconductor layer is also doped at a high concentration. These p-type and n-type semiconductor layers are stacked. The material of the p-type semiconductor layer and the n-type semiconductor layer has a lattice constant close to that of GaAs and InGaP. More particularly, an example of the material of the p-type semiconductor layer and the n-type semiconductor layer is GaAs, InGaP, or AlGaAs. A preferable thickness of the quantum tunneling layer 108 is not less than 20 nanometers and not more than 40 nanometers.

The material of the p-type contact layer 113 is not limited, as long as ohmic contacts are formed in the interface with the p-type window layer 107 and in the interface with the p-side electrode 115. An example of the material of the p-type contact layer 113 is p-type GaAs.

The material of the n-type contact layer 112 is not limited, as long as ohmic contacts are formed in the interface with the first n-type barrier layer 109 and in the interface with the n-side electrode 114. An example of the material of the n-type contact layer 112 is n-type GaAs.

As shown in FIG. 1B, the sides of the layers 103 to 113 are preferably covered with an insulating film 116. An example of the material of the insulating film 116 is non-doped InGaP, silicon dioxide, or silicon nitride.

Figure 4:
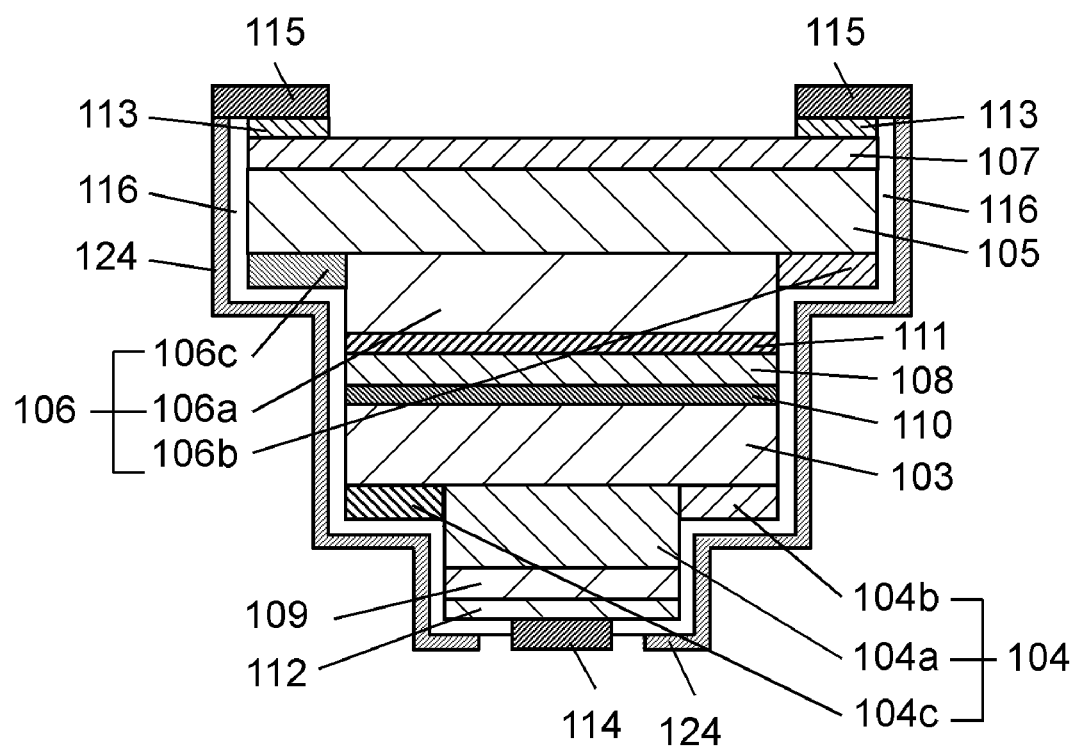
FIG. 4 shows a cross-sectional view of the solar cell according to the embodiment 1.
Figure 5:
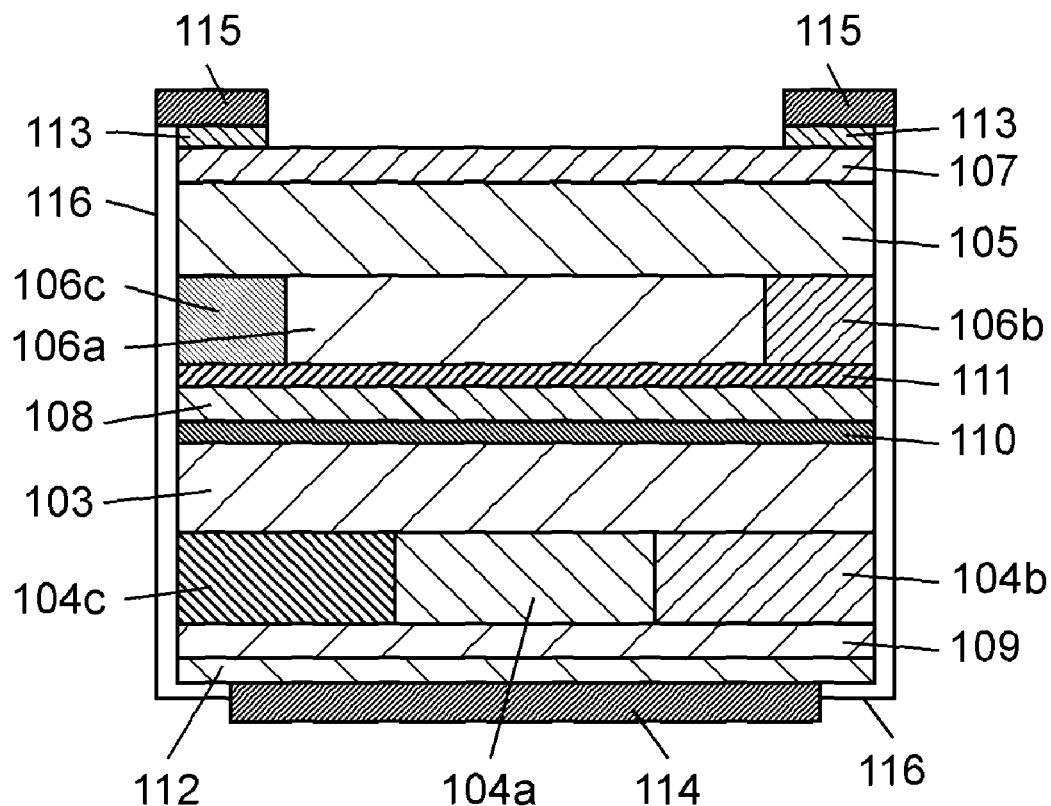
FIG. 5 shows a cross-sectional view of the solar cell element according to the comparative example 1.
Figure 6:
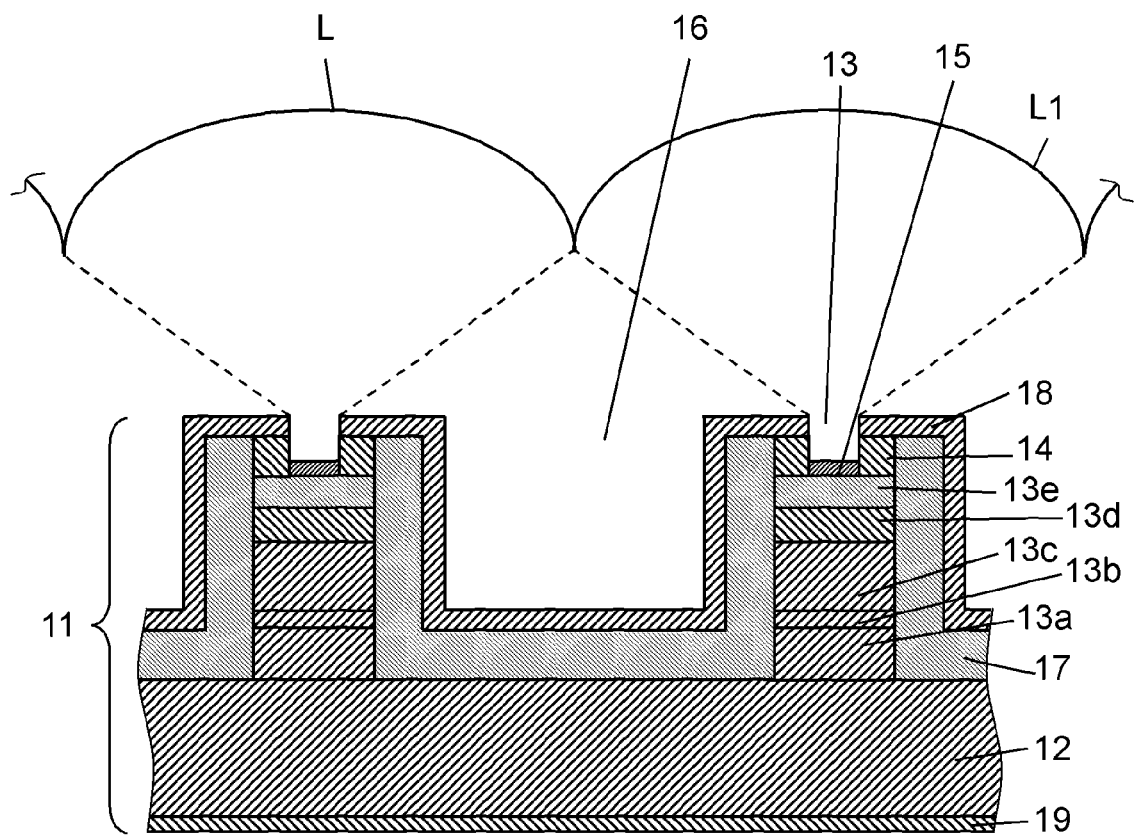
FIG. 6 shows a cross-sectional view of the solar cell disclosed in Patent Literature 1.
Figure 7:
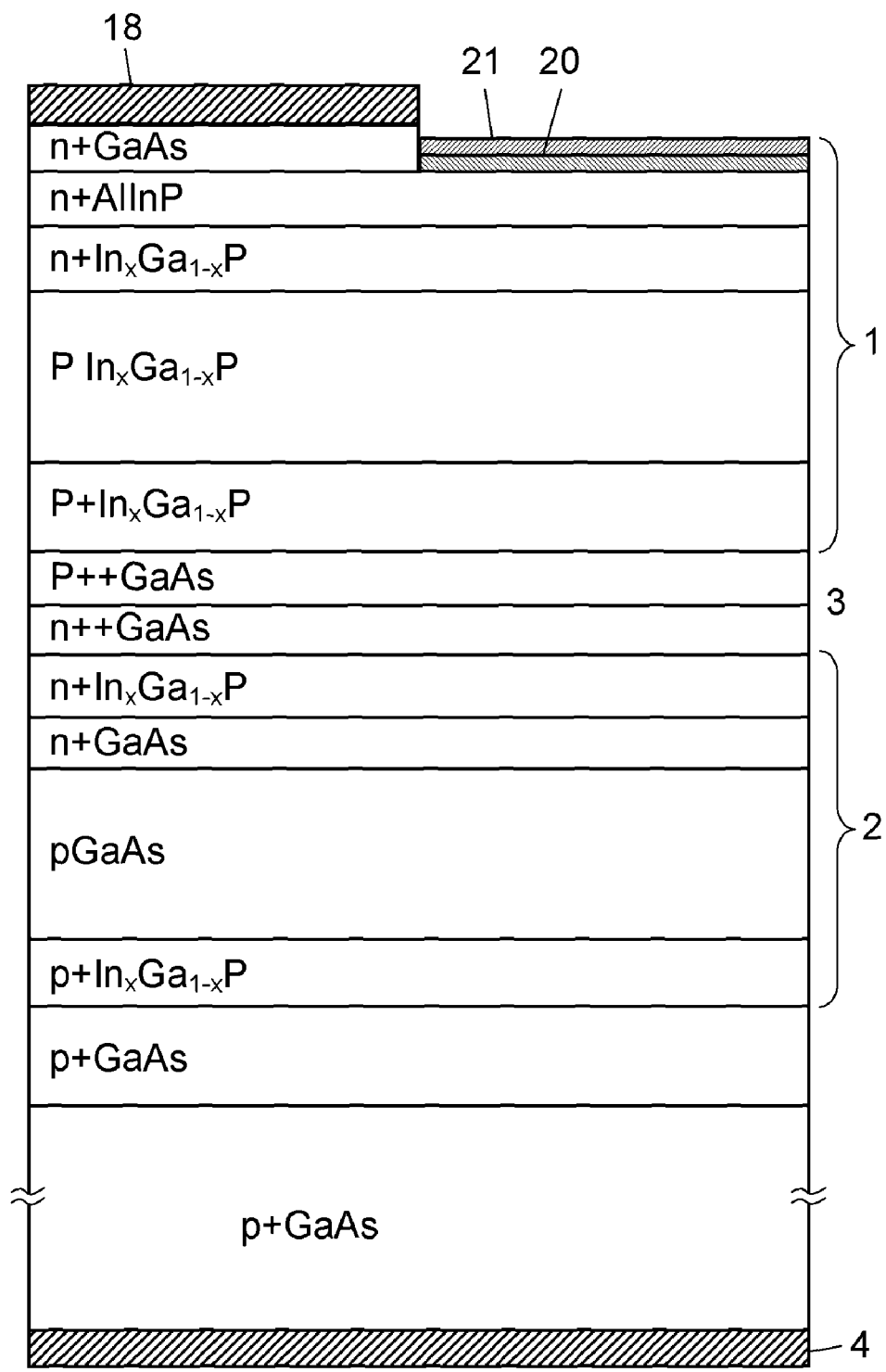
FIG. 7 shows a cross-sectional view of the solar cell element disclosed in Patent Literature 2.

When the insulating film 116 is used, as shown in FIG. 4, the insulating film 116 is covered with a metal film 124. The metal film 124 improves the heat radiation property of the solar cell element 102.

It is preferred that the metal film 124 is electrically connected with the p-side electrode 115 and that the metal film 124 and the n-side electrode 114 are exposed on one surface (in FIG. 4, the bottom surface).

(Method for Fabricating Solar Cell Element 102)

A method for fabricating a solar cell element 102 is described below with reference to FIGS. 3A to 3I1.

Figure 3A:
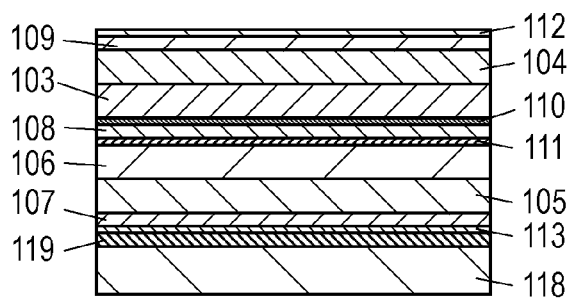
FIG. 3A shows a fabricating step of the solar cell element according to the embodiment 1.

First, as shown in FIG. 3A, a sacrificial layer 119, the p-type contact layer 113, the p-type window layer 107, the p-type InGaP layer 105, the n-type InGaP layer 106, the second n-type barrier layer 111, the quantum tunneling layer 108, the p-type barrier layer 110, the p-type GaAs layer 103, the n-type GaAs layer 104, the first n-type barrier layer 109, and the n-type contact layer 112 are formed in this order on the surface of a GaAs substrate 118 by a known semiconductor growth method such as a molecular beam epitaxy method or a metal organic chemical vapor deposition method (hereinafter, referred to as an "MOCVD method"). The sacrificial layer 119 has a lattice constant close to that of GaAs. The sacrificial layer 119 is a layer for being etched selectively against GaAs. An example of the material of the sacrificial layer 119 is AlAs.

Figure 3E:
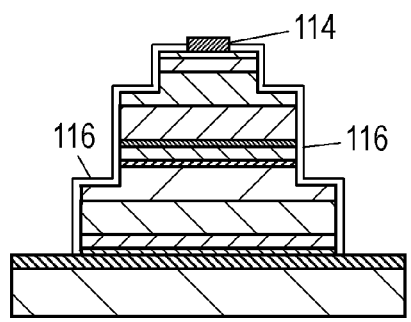
FIG. 3E shows a fabricating step of the solar cell element according to the embodiment 1.
Figure 3B:
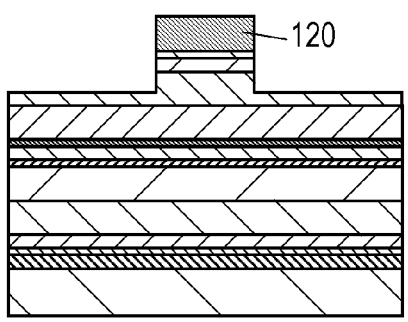
FIG. 3B shows a fabricating step of the solar cell element according to the embodiment 1.

Next, as shown in FIG. 3B, a first mask 120 is formed on the n-type contact layer 112. The first mask 120 has a width equal to the value of w1 shown in FIG. 2. The n-type contact layer 112 and the first n-type barrier layer 109 are etched with use of the first mask 120. Furthermore, the upper peripheral portion of the n-type GaAs layer 104 is etched. The etching depth of the n-type GaAs layer 104 is equal to the thickness of (d1-d3) shown in FIG. 2. In the etching, a mixed gas of BC13 and SF6 may be used.

Figure 3F:
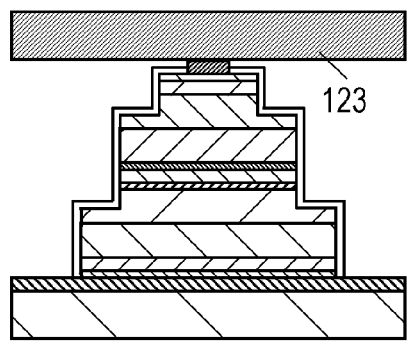
FIG. 3F shows a fabricating step of the solar cell element according to the embodiment 1.
Figure 3C:
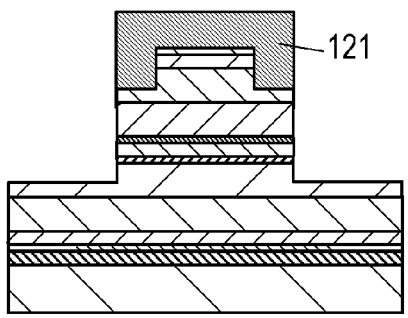
FIG. 3C shows a fabricating step of the solar cell element according to the embodiment 1.

As shown in FIG. 3C, the first mask 120 is removed and a second mask 121 is formed. The width of the second mask 121 is equal to the sum of (w1+w2+w3) shown in FIG. 2. The n-type GaAs layer 104, the p-type GaAs layer 103, the p-type barrier layer 110, the quantum tunneling layer 108, and the second n-type barrier layer 111 are etched with use of the second mask 121. Furthermore, the upper peripheral portion of the n-type InGaP layer 106 is etched. The etching depth of the n-type InGaP layer 106 is equal to the thickness of (d4−d5) shown in FIG. 2.

Figure 3G:
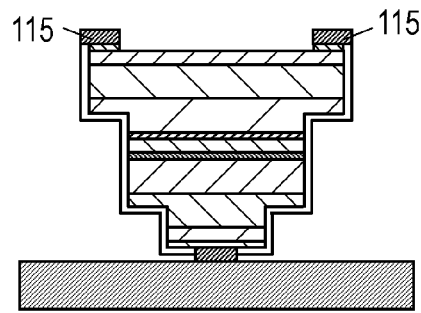
FIG. 3G shows a fabricating step of the solar cell element according to the embodiment 1.
Figure 3D:
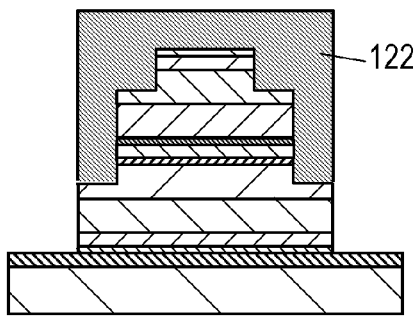
FIG. 3D shows a fabricating step of the solar cell element according to the embodiment 1.

As shown in FIG. 3D, the second mask 121 is removed and a third mask 122 is formed. The width of the third mask 122 is equal to the sum of (w1+w2+w3+w4+w5) shown in FIG. 2. The n-type InGaP layer 106, the p-type InGaP layer 105, the p-type window layer 107, and the p-type contact layer 113 are etched with use of the third mask 122.

As shown in FIG. 3E, the third mask 122 is removed. The n-side electrode 114 and the insulating film 116 are formed. An example of forming the n-side electrode 114 is a sputtering method or an electron beam deposition technique. An example of forming the insulating film 116 is a chemical vapor deposition method.

As shown in FIG. 3F, a base substrate 123 is fixed to the n-side electrode 114. The GaAs substrate 118 and the sacrificial layer 119 are removed by etching. An example of the base substrate 123 is a silicon substrate or a glass substrate. A wax or an adhesive sheet may be interposed between the n-side electrode 114 and the base substrate 123 optionally.

As shown in FIG. 3G, the p-side electrode 115 is formed on the p-type contact layer 113. Furthermore, a part of the p-type contact layer 113 which is not in contact with the p-side electrode 115 is removed by etching. An example of forming the p-side electrode 115 is a sputtering method or an electron beam deposition technique.

Figure 3H:
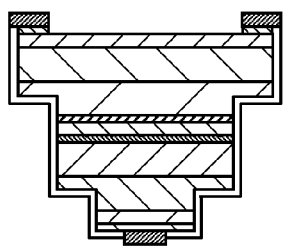
FIG. 3H shows a fabricating step of the solar cell element according to the embodiment 1.

Finally, as shown in FIG. 3H, the base substrate 123 is removed. Thus, the solar cell element 102 is obtained. As shown in FIG. 1A, the obtained solar cell element 102 is fixed to the condensing lens 101. Thus, the solar cell is obtained.

(Step (b))

In the step (b), the p-type window layer 107 is irradiated with the light through the condensing lens 101 to generate a potential difference between the n-side electrode 114 and the p-side electrode 115. As shown in FIG. 2, a region S of the p-type window layer 107 is irradiated with the light.

The present inventors discovered that the following inequation set (II) is required to be satisfied in the step (b).

$$w6 < w1 \tag{II}$$

As described above, the value of w1 represents the width of the GaAs center part 104a along the X-direction.

The value of w6 represents a width of the region S along the X-direction.

When seen along the Z-direction, the GaAs center part 104a overlaps with the region S.

In the case where the inequation set (II) is not satisfied, the higher conversion efficiency is not achieved (see the comparative example 3 and the comparative examples 13 to 16).

As shown in FIG. 2, when the equation: (w1+w2+w3+w4+w5)=(w6+w7+w8) is satisfied, the width of w7 is equal to or greater than the width of (w2+w4). When the equation: (w1+w2+w3+w4+w5)=(w6+w7+w8) is satisfied, the width of w6 is equal to or greater than the width of (w3+w5). Both of w7 and w8 correspond to the part which is not irradiated with the light.

EXAMPLES

The present invention is described in more detail by the following examples.

Example 1

In the example 1, the solar cell element 102 shown in FIG. 2 was fabricated by the method shown in FIGS. 3A to 3H.

Table 1 shows the composition and the thickness of each layer in the solar cell element 102 according to the example 1.

TABLE 1

| Layers | Composition | Dopant Element | Dopant Concentration | Thickness (micrometer) |
|---|---|---|---|---|
| n-type contact layer 112 | GaAs | Te | $2.0 \times 10^{19}$ | 0.1 |
| First n-type barrier layer 109 | InGaP | Te | $1.0 \times 10^{19}$ | 0.05 |
| n-type GaAs layer 104 | GaAs | Si | $1.0 \times 10^{18}$ | 2.4 |
| p-type GaAs layer 103 | GaAs | Zn | $3.0 \times 10^{17}$ | 0.2 |
| p-type barrier layer 110 | InGaP | Zn | $1.0 \times 10^{19}$ | 0.05 |
| Quantum tunneling layer 108 | GaAs | C | $1.0 \times 10^{20}$ | 0.012 |
|  | AlGaAs | Te | $1.0 \times 10^{19}$ | 0.012 |
| Second n-type barrier layer 111 | InAlP | Te | $1.0 \times 10^{19}$ | 0.05 |
| n-type InGaP layer 106 | InGaP | Si | $1.0 \times 10^{18}$ | 0.9 |
| p-type InGaP layer 105 | InGaP | Zn | $3.0 \times 10^{17}$ | 0.1 |
| p-type window layer 107 | InAlGaP | Zn | $1.0 \times 10^{19}$ | 0.05 |
| p-type contact layer 113 | GaAs | C | $1.0 \times 10^{19}$ | 0.02 |
| Sacrificial layer 119 | AlAs | C | $1.0 \times 10^{19}$ | 0.1 |
| Substrate 118 | GaAs | Zn | $2.0 \times 10^{18}$ | 350 |

In the example 1, d1 to d6 and w1 to w5 were described as below.
- d1: 2.4 micrometers
- d2: 4 nanometers
- d3: 4 nanometers
- d4: 0.9 micrometer
- d5: 4 nanometers
- d6: 4 nanometers
- w1: 80 micrometers
- w2: 5 micrometers
- w3: 5 micrometers
- w4: 5 micrometers
- w5: 5 micrometers The condensing lens 101 was 4 millimeters square and had a thickness of 3 mm. The condensing lens 101 had a focus spot of 80 micrometers square.

The solar cell according to the example 1 was fabricated as below.

First, as shown in FIG. 3A, the layers 104 to 119 shown in Table 1 were grown on the non-doped GaAs substrate 118 by an MOCVD method.

Next, as shown in FIG. 3B, a square resist film having 80 micrometers square was formed on the n-type contact layer 112 by photolithography. Using this resist film as a first mask 120, the n-type contact layer 112 and the first n-type barrier layer 109 were removed by ICP plasma etching with use of a mixed gas of BC13 and SF6. Furthermore, almost all of the peripheral part of the n-type GaAs layer 104 was etched in such a manner that the peripheral part of the n-type GaAs layer 104 was left slightly.

After etching, the thickness of the remaining peripheral part of the n-type GaAs layer 104 was measured with a transmission electron microscope. The thickness was 4 nanometers.

The first mask 120 was removed with a detachment liquid. After removed, a square resist film having 90 micrometers square was formed as the second mask 121. The center of the resist film corresponded with the center of the first mask 120.

Using the second mask 121, the n-type GaAs layer 104, the p-type GaAs layer 103, the p-type barrier layer 110, the quantum tunneling layer 108, and the second n-type barrier layer 111 were etched. Furthermore, as shown in FIG. 3C, almost all of the peripheral part of the n-type InGaP layer 106 was etched in such a manner that the peripheral part of the n-type InGaP layer 106 was left slightly.

After etching, the thickness of the remaining peripheral part of the n-type InGaP layer 106 was measured with a transmission electron microscope. The thickness was 4 nanometers.

The second mask 121 was removed with a detachment liquid. After removed, a square resist film having 100 micrometers square was formed as the third mask 122. The center of the resist film corresponded with the center of the first mask 120 and the center of the second mask 121.

Using the third mask 122, as shown in FIG. 3D, the n-type InGaP layer 106, the p-type InGaP layer 105, the p-type window layer 107, and the p-type contact layer 113 were etched so as to expose the sacrificial layer 119.

After etching, the third mask 122 was removed with a resist stripper liquid. After removed, as shown in FIG. 3E, a titanium film with a thickness of 50 nanometers and a gold film with a thickness of 250 nanometers were stacked on the n-type contact layer 112 to form the n-side electrode 114 with use of an electron beam deposition device.

Next, as shown in FIG. 3E, the insulating film 116 made of SiN with a thickness of 400 nanometers was formed with use of a plasma chemical vapor deposition device.

Next, wax was applied with a spin coater to the surface where the n-side electrode 114 was formed. After the wax was dried, as shown in FIG. 3F, the n-side electrode 114 was fixed to the base substrate 123 made of glass.

After fixed, the GaAs substrate 118 was removed with use of a mixture of citric acid and hydrogen peroxide. Subsequently, the sacrificial layer 119 was removed with use of buffered hydrofluoric acid to expose the p-type contact layer 113. Thus, the structure shown in FIG. 3F was obtained.

As shown in FIG. 3G, a titanium film having a thickness of 50 nanometers, a platinum film having a thickness of 150 nanometers, and a gold film having a thickness of 250 nanometers were formed in this order on the p-type contact layer 113 to form the p-side electrode 115 with use of an electron beam deposition device.

After the p-side electrode 115 was formed, the wax was dissolved with isopropanol to remove the base substrate 123. Thus, the solar cell element 102 shown in FIG. 311 was obtained.

The obtained solar cell element 102 was attached to the condensing lens 101 in such a manner that the center of the focus position of the condensing lens 101 corresponded with the center of the solar cell element 102. In this manner, the solar cell according to the example 1 was obtained.

The solar cell according to the example 1 was irradiated with sunlight under the condition that w6=80 micrometers and w7=w8=10 micrometers. The volt-ampere characteristics of the solar cell according to the example 1 were measured, and the conversion efficiency was calculated. Table 2 shows them with the data of the examples 2 to 13 and the comparative examples 1 to 16.

The conversion efficiency was calculated according to the following equation (I):

(Conversion efficiency)=(Maximum output value from the solar cell)/(Energy of the sunlight)   (Equation I)

The maximum output value described in the above-mentioned equation (I) denotes the maximum value of the output value defined by the following equation (II):

(Output value)=(Current density obtained from the solar cell)·(Bias voltage obtained from the solar cell)

For more detail, see the pages 11 to 13 disclosed in Non-Patent Literature 1 such as Jenny Nelson, "The Physics of Solar Cells", World Scientific Pub. Co. Inc.

TABLE 2

|  | d1 [um] | d2 (=d3) [um] | d4 [um] | d5 (=d6) [um] | w1 [um] | w2 (=w3) [um] | w4 (=w5) [um] | w6 [um] | w7 (=w8) [um] | Conversion Efficiency [%] |
|---|---|---|---|---|---|---|---|---|---|---|
| Example 1 | 2.4 | 0.004 | 0.9 | 0.004 | 80 | 5 | 5 | 80 | 10 | 28.51 |
| Example 2 | 2.4 | 0.002 | 0.9 | 0.004 | 80 | 5 | 5 | 80 | 10 | 28.56 |
| Example 3 | 2.4 | 0.001 | 0.9 | 0.004 | 80 | 5 | 5 | 80 | 10 | 28.58 |
| Example 4 | 2.4 | 0.004 | 0.9 | 0.005 | 80 | 5 | 5 | 80 | 10 | 28.44 |
| Example 5 | 2.4 | 0.004 | 0.9 | 0.002 | 80 | 5 | 5 | 80 | 10 | 28.53 |

TABLE 2-continued

|  | d1 [μm] | d2 (=d3) [μm] | d4 [μm] | d5 (=d6) [μm] | w1 [μm] | w2 (=w3) [μm] | w4 (=w5) [μm] | w6 [μm] | w7 (=w8) [μm] | Conversion Efficiency [%] |
|---|---|---|---|---|---|---|---|---|---|---|
| Example 6 | 2.4 | 0.004 | 0.9 | 0.001 | 80 | 5 | 5 | 80 | 10 | 28.38 |
| Example 7 | 2.4 | 0.004 | 0.9 | 0.004 | 89.8 | 0.1 | 5 | 80 | 10 | 28.18 |
| Example 8 | 2.4 | 0.004 | 0.9 | 0.004 | 89 | 0.5 | 5 | 80 | 10 | 28.27 |
| Example 9 | 2.4 | 0.004 | 0.9 | 0.004 | 89.8 | 5 | 0.1 | 80 | 10 | 28.14 |
| Example 10 | 2.4 | 0.004 | 0.9 | 0.004 | 89 | 5 | 0.5 | 80 | 10 | 28.16 |
| Example 11 | 2.4 | 0.004 | 0.9 | 0.004 | 80 | 5 | 5 | 76 | 12 | 28.49 |
| Example 12 | 2.4 | 0.004 | 0.9 | 0.004 | 60 | 10 | 10 | 60 | 20 | 28.03 |
| Example 13 | 2.4 | 0.004 | 0.9 | 0.004 | 60 | 10 | 10 | 56 | 22 | 27.84 |
| Comparative Example 1 | 2.4 | 2.4 | 0.9 | 0.9 | 80 | 5 | 5 | 100 | 0 | 25.12 |
| Comparative Example 2 | 2.4 | 2.4 | 0.9 | 0.9 | 80 | 5 | 5 | 80 | 10 | 27.11 |
| Comparative Example 3 | 2.4 | 0.004 | 0.9 | 0.004 | 80 | 5 | 5 | 100 | 0 | 21.92 |
| Comparative Example 4 | 2.4 | 0.1 | 0.9 | 0.004 | 80 | 5 | 5 | 80 | 10 | 25.96 |
| Comparative Example 5 | 2.4 | 0.01 | 0.9 | 0.004 | 80 | 5 | 5 | 80 | 10 | 26.16 |
| Comparative Example 6 | 2.4 | 0.005 | 0.9 | 0.004 | 80 | 5 | 5 | 80 | 10 | 26.93 |
| Comparative Example 7 | 2.4 | 0 | 0.9 | 0.004 | 80 | 5 | 5 | 80 | 10 | 26.17 |
| Comparative Example 8 | 2.4 | 0.004 | 0.9 | 0.1 | 80 | 5 | 5 | 80 | 10 | 27.29 |
| Comparative Example 9 | 2.4 | 0.004 | 0.9 | 0.01 | 80 | 5 | 5 | 80 | 10 | 27.25 |
| Comparative Example 10 | 2.4 | 0.004 | 0.9 | 0 | 80 | 5 | 5 | 80 | 10 | 27.27 |
| Comparative Example 11 | 2.4 | 0.004 | 0.9 | 0.004 | 89.9 | 0.05 | 5 | 80 | 10 | 25.90 |
| Comparative Example 12 | 2.4 | 0.004 | 0.9 | 0.004 | 89.9 | 5 | 0.05 | 80 | 10 | 27.30 |
| Comparative Example 13 | 2.4 | 0.004 | 0.9 | 0.004 | 80 | 5 | 5 | 88 | 6 | 23.79 |
| Comparative Example 14 | 2.4 | 0.004 | 0.9 | 0.004 | 80 | 5 | 5 | 84 | 8 | 26.49 |
| Comparative Example 15 | 2.4 | 0.004 | 0.9 | 0.004 | 60 | 10 | 10 | 68 | 16 | 22.00 |
| Comparative Example 16 | 2.4 | 0.004 | 0.9 | 0.004 | 60 | 10 | 10 | 64 | 18 | 25.48 |

Example 2

The experiment identical to that of the example 1 was performed except that $d2=d3=2$ nanometers.

Example 3

The experiment identical to that of the example 1 was performed except that $d2=d3=1$ nanometer.

Example 4

The experiment identical to that of the example 1 was performed except that $d5=d6=5$ nanometers.

Example 5

The experiment identical to that of the example 1 was performed except that $d5=d6=2$ nanometers.

Example 6

The experiment identical to that of the example 1 was performed except that $d5=d6=1$ nanometer.

Example 7

The experiment identical to that of the example 1 was performed except that $w1=89.8$ micrometers and $w2=w3=0.1$ micrometer.

Example 8

The experiment identical to that of the example 1 was performed except that $w1=89$ micrometers and $w2=w3=0.5$ micrometer.

Example 9

The experiment identical to that of the example 1 was performed except that $w1=89.8$ micrometers and $w4=w5=0.1$ micrometer.

Example 10

The experiment identical to that of the example 1 was performed except that $w1=89$ micrometers and $w4=w5=0.5$ micrometer.

Example 11

The experiment identical to that of the example 1 was performed except that $w6=76$ micrometers and $w7=w8=12$ micrometers.

Example 12

The experiment identical to that of the example 1 was performed except that $w1=60$ micrometers, $w2=w3=w4=w5=10$ micrometers, $w6=60$ micrometers, and $w7=w8=20$ micrometers.

Example 13

The experiment identical to that of the example 1 was performed except that w1=60 micrometers, w2=w3=w4=w5=10 micrometers, w6=56 micrometers, and w7=w8=22 micrometers.

Comparative Example 1

The experiment identical to that of the example 1 was performed except that d2=d3=2.4 micrometers, d4=d5=0.9 micrometer, and w6=100 micrometers.

Comparative Example 2

The experiment identical to that of the example 1 was performed except that d2=d3=2.4 micrometers and d4=d5=0.9 micrometer.

Comparative Example 3

The experiment identical to that of the example 1 was performed except that w6=100 micrometers.

Comparative Example 4

The experiment identical to that of the example 1 was performed except that d2=d3=0.1 micrometer.

Comparative Example 5

The experiment identical to that of the example 1 was performed except that d2=d3=0.01 micrometer.

Comparative Example 6

The experiment identical to that of the example 1 was performed except that d2=d3=0.005 micrometer.

Comparative Example 7

The experiment identical to that of the example 1 was performed except that d2=d3=0 micrometers.

Comparative Example 8

The experiment identical to that of the example 1 was performed except that d5=d6=0.1 micrometer.

Comparative Example 9

The experiment identical to that of the example 1 was performed except that d5=d6=0.01 micrometer.

Comparative Example 10

The experiment identical to that of the example 1 was performed except that d5=d6=0 micrometers.

Comparative Example 11

The experiment identical to that of the example 1 was performed except that w1=89.9 micrometers and w2=w3=0.05 micrometer.

Comparative Example 12

The experiment identical to that of the example 1 was performed except that w1=89.9 micrometers and w4=w5=0.05 micrometer.

Comparative Example 13

The experiment identical to that of the example 1 was performed except that w6=88 micrometers and w7=w8=6 micrometers.

Comparative Example 14

The experiment identical to that of the example 1 was performed except that w6=84 micrometers and w7=w8=8 micrometers.

Comparative Example 15

The experiment identical to that of the example 1 was performed except that w1=60 micrometers, w2=w3=w4=w5=10 micrometers, w6=68 micrometers, and w7=w8=16 micrometers.

Comparative Example 16

The experiment identical to that of the example 1 was performed except that w1=60 micrometers, w2=w3=w4=w5=10 micrometers, w6=64 micrometers, and w7=w8=18 micrometers.

As is clear from Table 2, when the following inequation set: $d2<d1$, $d3<d1$, 1 nanometer$\leq d2\leq 4$ nanometers, 1 nanometer$\leq d3\leq 4$ nanometers, $d5<d4$, $d6<d4$, 1 nanometer$\leq d5\leq 5$ nanometers, 1 nanometer$\leq d6\leq 5$ nanometers, 100 nannometers$\leq w2$, 100 nanometers$\leq w3$, 100 nannometers$\leq w4$, 100 nannometers$\leq w5$, and $w6\leq w1$ is satisfied, a high conversion efficiency of 28% or more is achieved.

The examples 1 to 13 and the comparative examples 1 and 2 show that it is necessary that the following inequation set: $d2<d1$, $d3<d1$, $d5<d4$, and $d6<d4$ is satisfied.

The examples 1 to 3 and the comparative examples 4 to 7 show that it is necessary that the following inequation set: 1 nanometer$\leq d2\leq 4$ nanometers and 1 nanometer$\leq d3\leq 4$ nanometers is satisfied.

The examples 1 and 4 to 6 and the comparative examples 8 to 10 show that it is necessary that the following inequation set: 1 nanometer$\leq d5\leq 5$ nanometers and 1 nanometer$\leq d6\leq 5$ nanometers is satisfied.

The examples 7 and 8 and the comparative example 11 show that it is necessary that the following inequation set: 100 nanometers$\leq w2$ and 100 nannometers$\leq w3$ is satisfied.

The examples 9 and 10 and the comparative example 12 show that it is necessary that the following inequation set: 100 nanometers$\leq w4$ and 100 nannometers$\leq w5$ is satisfied.

The examples 1, 11 to 13 and the comparative examples 13 to 16 show that it is necessary that the following inequation: $w6\leq w1$ is satisfied.

INDUSTRIAL APPLICABILITY

The present invention provides a solar cell with higher conversion efficiency.

REFERENCE SIGNS LIST

| | |
|---|---|
| 1 | top cell |
| 2 | bottom cell |
| 3 | quantum tunneling layer |
| 11 | solar cell element |
| 12 | semiconductor substrate |
| 13a | p-type GaAs buffer layer |
| 13b | p-type InGaP-BSF layer |
| 13c | p-type GaAs base layer |
| 13d | n-type GaAs emitter layer |
| 13e | n-type InGaP window layer |
| 15 | antireflection layer |
| 101 | lens |
| 102 | solar cell element |
| 103 | p-type GaAs layer |
| 104 | n-type GaAs layer |
| 104a | GaAs center part |
| 104b | first GaAs peripheral part |
| 104c | second GaAs peripheral part |
| 105 | p-type InGaP layer |
| 106 | n-type InGaP layer |
| 106a | InGaP center part |
| 106b | first InGaP peripheral part |
| 106c | second InGaP peripheral part |
| 107 | p-type window layer |
| 108 | quantum tunneling layer |
| 109 | first n-type barrier layer |
| 110 | p-type barrier layer |
| 111 | second n-type barrier layer |
| 112 | n-type contact layer |
| 113 | p-type contact layer |
| 114 | n-side electrode |
| 115 | p-side electrode |
| 116 | insulating film |
| 117 | sunlight |
| 118 | GaAs substrate |
| 119 | sacrificial layer |
| 120 | first mask |
| 121 | second mask |
| 122 | third mask |
| 123 | base substrate |
| 124 | metal film |

The invention claimed is:

1. A method for generating electric power with use of a solar cell, the method comprising steps of:

(a) preparing the solar cell comprising a condensing lens and a solar cell element, wherein the solar cell element comprises an n-type GaAs layer, a p-type GaAs layer, a quantum tunneling layer, an n-type InGaP layer, a p-type InGaP layer, a p-type window layer, an n-side electrode, and a p-side electrode;

a Z-direction denotes the direction of the normal line of the p-type GaAs layer;

an X-direction denotes a direction orthogonal to the Z-direction, the n-type GaAs layer, the p-type GaAs layer, the quantum tunneling layer, the n-type InGaP layer, the p-type InGaP layer, and the p-type window layer are stacked along the Z-direction in this order;

the p-type window layer is made of a p-type compound semiconductor having a wider bandgap than InGaP, the n-side electrode is electrically connected with the n-type GaAs layer;

the p-side electrode is electrically connected with the p-type InGaP layer;

the n-type GaAs layer is divided into a GaAs center part, a first GaAs peripheral part, and a second GaAs peripheral part;

the GaAs center part is interposed between the first GaAs peripheral part and the second GaAs peripheral part along the X-direction;

the first GaAs peripheral part and the second GaAs peripheral part have a shape of a layer, the n-type InGaP layer is divided into an InGaP center part, a first InGaP peripheral part, and a second InGaP peripheral part;

the InGaP center part is interposed between the first InGaP peripheral part and the second InGaP peripheral part along the X-direction;

the first InGaP peripheral part and the second InGaP peripheral part have a shape of a layer, the following inequation set (I) is satisfied:

$$d2<d1,\ d3<d1,\ 1\ \text{nanometer} \leq d2 \leq 4\ \text{nanometers},\ 1\ \text{nanometer} \leq d3 \leq 4\ \text{nanometers},\ d5<d4,\ d6<d4,\ 1\ \text{nanometer} \leq d5 \leq 5\ \text{nanometers},\ 1\ \text{nanometer} \leq d6 \leq 5\ \text{nanometers},\ 100\ \text{nanometers} \leq w2,\ 100\ \text{nanometers} \leq w3,\ 100\ \text{nanometers} \leq w4,\ \text{and}\ 100\ \text{nanometers} \leq w5 \quad (I);$$

wherein $d1$ represents a thickness of the GaAs center part along the Z-direction;

$d2$ represents a thickness of the first GaAs peripheral part along the Z-direction;

$d3$ represents a thickness of the second GaAs peripheral part along the Z-direction;

$d4$ represents a thickness of the InGaP center part along the Z-direction;

$d5$ represents a thickness of the first InGaP peripheral part along the Z-direction;

$d6$ represents a thickness of the second InGaP peripheral part along the Z-direction;

$w2$ represents a width of the first GaAs peripheral part along the X-direction;

$w3$ represents a width of the second GaAs peripheral part along the X-direction;

$w4$ represents a width of the first InGaP peripheral part along the X-direction; and $w5$ represents a width of the second InGaP peripheral part along the X-direction; and (b) irradiating a region S which is included in the surface of the p-type window layer through the condensing lens with light in such a manner that the following inequation (II) is satisfied so as to generate a potential difference between the n-side electrode and the p-side electrode:

$$w6 \leq w1 \quad (II);$$

wherein $w1$ represents a width of the GaAs center part along the X-direction;

$w6$ represents a width of the region S along the X-direction in the cross-sectional view which includes the Z-direction; and the first GaAs center part overlaps the region (S) when seen from the Z-direction.

2. The method according to claim 1, wherein the width of the n-type InGaP layer is equal to the width of the p-type window layer.

3. The method according to claim 1, wherein the solar cell element further comprises an n-type barrier layer interposed between the n-side electrode and the GaAs center part.

4. The method according to claim 1, wherein the solar cell element further comprises an n-type contact layer interposed between the n-side electrode and the GaAs center part.

5. The method according to claim 1, wherein the solar cell element further comprises a p-type contact layer interposed between the p-side electrode and the p-type InGaP layer.

6. The method according to claim 1, wherein the solar cell element further comprises an n-type barrier layer interposed between the quantum tunneling layer and the InGaP center part.

7. The method according to claim 1, wherein the solar cell element further comprises a p-type barrier layer interposed between the p-type GaAs layer and the quantum tunneling layer.

8. The method according to claim 1, wherein the sides of the n-type GaAs layer, the p-type GaAs layer, the quantum tunneling layer, the n-type InGaP layer, the p-type InGaP layer, and the p-type window layer are covered by an insulating film.

* * * * *